(12) United States Patent
Jensen

(10) Patent No.: US 6,604,222 B1
(45) Date of Patent: Aug. 5, 2003

(54) BLOCK CODE TO EFFICIENTLY CORRECT ADJACENT DATA AND/OR CHECK BIT ERRORS

(75) Inventor: David W. Jensen, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 09/303,527

(22) Filed: Apr. 30, 1999

(51) Int. Cl.[7] .............................................. H03M 13/00

(52) U.S. Cl. .................................................... 714/785

(58) Field of Search ................................ 714/768, 767, 714/773, 805, 757, 785, 753, 818, 758, 762, 746, 777; 341/52; 375/362, 368

(56) References Cited

U.S. PATENT DOCUMENTS

| | | | | | |
|---|---|---|---|---|---|
| 3,766,521 A | * | 10/1973 | Carter et al. | ................. | 714/757 |
| 3,771,126 A | * | 11/1973 | Apple, Jr. | ................... | 714/782 |
| 4,605,921 A | * | 8/1986 | Riddle et al. | ................. | 341/52 |
| 5,631,915 A | * | 5/1997 | Meaney et al. | ............. | 714/757 |
| 5,841,795 A | * | 11/1998 | Olarig et al. | ................ | 714/767 |

OTHER PUBLICATIONS

NN6708229(Decoding Circuits With a Minimum of N Shift Register Stages; IBM Technical Disclosure Bulletin, Aug. 1967, US vol. No.: 10, p. No.: 229–231).*
NN71053715(Error Detection and Correction; IBM Technical Disclosure Bulletin, Aug. 1967, US; vol. No.: 13, May 1971p. No.: 3715–3716).*
NN73101432(Random Access Memory Implementation of Interlaced Error Correction Codes; IBM Technical Disclosure Bulletin Oct. 1973, US; vol. No.: 16, p. No.: 1432–1436).*
NN78023579(Error Migration Protection for Multiprocessor with Hierarchical Memory; IBM Technical Disclosure Bulletin, Feb. 1978, US; vol. No.: 20, p. No.: 3579–3580).*
NB82046120(Symmetrical Odd Weight (39,32) DED/SEC Code With Package Error Detection; IBM Technical Disclosure Bulletin, Apr. 1, 1982, US; vol. No.: 24, p. No.: 6120–6121).*
NB9109229 (Systematic (12,8) Code for Correcting Single Errors And Detecting Adjacent Errors; IBM Technical Disclosure Bulletin, Sep. 1, 1991, US, vol. No.: 34, p. No.: 229).*
Lin, S. and Costello Jr., D., "Coding for Reliable Digital Transmission and Storage", Error Correcting Coding: Fundamental and Applications, Prentice Hall, Inc.
Siewiorek, D. P. and Swarz, R. S., "Chucksums", The Theory and Practice of Reliable System Design, Digital, 1982, pp. 92–98.
Lin, S. and Costell, Jr., D., "Error Control Coding: Fundamental and Applications", Prentice Hall, 1983, Chapter 4 Cyclic Codes pp. 85–116.
Buol, S., "Neutron–Induced Single Event Upsets Or NSEU", Rockwell Collins Presentation, GenAv FCC Hardware Engineering, Apr. 1993.

(List continued on next page.)

*Primary Examiner*—Albert Decady
*Assistant Examiner*—Guy Lamarre
(74) *Attorney, Agent, or Firm*—Nathan O. Jensen; Kyle Eppele

(57) ABSTRACT

A block code for correcting adjacent errors and almost-adjacent errors that occur in semiconductor memory data, with such errors possibly being caused by a neutron single event upset (NSEU). A block code includes a generator matrix that has columns in which an exclusive-or of adjacent or almost-adjacent columns provides a unique value for each of the possible combination of columns of the generator matrix. As such, a computed syndrome can be used to effectively correct for any adjacent errors and almost-adjacent errors, as well as double-adjacent errors, double-adjacent errors, and triple-almost-adjacent errors.

20 Claims, 11 Drawing Sheets

| SYNDROMES FOR SINGLE, DOUBLE, AND TRIPLE ERRORS ||||||||
|---|---|---|---|---|---|---|---|
| SINGLE | DOUBLE ||| TRIPLE ||| DATA BIT TO INVERT |
| X | X-1 X | X X+1 | X-2 X | X-2 X-1 X | X-1 X X+1 | X X+1 X-2 | |
| 09 | - | 1B | - | 2D | - | - | 3F | $d_0$ |
| 12 | 1B | 36 | - | 53 | - | 3F | 77 | $d_1$ |
| 24 | 36 | 65 | 2D | 2F | 3F | 77 | 6E | $d_2$ |
| 41 | 65 | 4A | 53 | 54 | 77 | 6E | 5F | $d_3$ |
| 0B | 4A | 1E | 2F | 4F | 6E | 5F | 5A | $d_4$ |
| 15 | 1E | 51 | 54 | 37 | 5F | 5A | 73 | $d_5$ |
| 44 | 51 | 66 | 4F | 57 | 5A | 73 | 75 | $d_6$ |
| 22 | 66 | 31 | 37 | 4E | 73 | 75 | 5D | $d_7$ |
| 13 | 31 | 7F | 57 | 27 | 75 | 5D | 4B | $d_8$ |
| 6C | 7F | 58 | 4E | 1A | 5D | 4B | 2E | $d_9$ |
| 34 | 58 | 42 | 27 | 4D | 4B | 2E | 3B | $d_{10}$ |
| 76 | 42 | 0F | 1A | 35 | 2E | 3B | 4C | $d_{11}$ |
| 79 | 0F | 3A | 4D | 6F | 3B | 4C | 2C | $d_{12}$ |
| 43 | 3A | 55 | 35 | 2B | 4C | 2C | 3D | $d_{13}$ |
| 16 | 55 | 7E | 6F | - | 2C | 3D | - | $d_{14}$ |
| 68 | 7E | - | 2B | - | 3D | - | - | $d_{15}$ |

$c_0 = d_0 \oplus d_3 \oplus d_4 \oplus d_5 \oplus d_8 \oplus d_{12} \oplus d_{13}$
$c_1 = d_1 \oplus d_4 \oplus d_7 \oplus d_8 \oplus d_{11} \oplus d_{13} \oplus d_{14}$
$c_2 = d_2 \oplus d_5 \oplus d_6 \oplus d_9 \oplus d_{10} \oplus d_{11} \oplus d_{14}$
$c_3 = d_0 \oplus d_4 \oplus d_9 \oplus d_{12} \oplus d_{15}$
$c_4 = d_1 \oplus d_5 \oplus d_8 \oplus d_{10} \oplus d_{11} \oplus d_{12} \oplus d_{14}$
$c_5 = d_2 \oplus d_7 \oplus d_9 \oplus d_{10} \oplus d_{11} \oplus d_{12} \oplus d_{15}$
$c_6 = d_3 \oplus d_6 \oplus d_9 \oplus d_{11} \oplus d_{12} \oplus d_{13} \oplus d_{15}$

OTHER PUBLICATIONS

Siewiorek, D. and Swarz, R. "Error Correcting Codes", The Theory and Practice of Reliable System Design, Digital, 1982, pp. 122–133.

Olson, J. et al, "Neutron–Induced Single Event Upsets in Static RAMS Observed at 10 KM Flight Altitude", IEEE Transaction On Nuclear Science, vol. 40, No. 2, Apr. 1993.

Goldberg, D., "The Simple Genetic Algorithm", Advance Technology Center—White Paper Original Published: Apr. 24, 1998, Version 1.3—Jun. 9, 1998.

Karlsson, J. et al, "Using Heavy–Ion Radiation to Validate Fault–Handing Mechanisms" IEEE Micro, vol. 14, Feb. 1994, pp. 8–23.

Sosnowski, J., "Transient Fault Tolerance in Digital System", IEEE Micro, vol. 14, Feb. 1994, pp. 25–35.

Jang, J.–S. R. et al, "Neuor–Fuzzy and Soft Computing: A Computational Approach to Learning and Machine Intelligence", Englewood Cliffs, NJ, Published by Prentice Hall, 1983, pp. 175–180.

* cited by examiner $$\begin{bmatrix} 1010101 \\ 0110011 \\ 0001111 \end{bmatrix} \begin{bmatrix} c0 \\ c1 \\ d0 \\ c2 \\ d1 \\ d2 \\ d3 \end{bmatrix} = \begin{bmatrix} S_0 & S_1 & S_2 \end{bmatrix}$$

$c_0 \oplus d_0 \oplus d_1 \oplus d_3 = S_0$ $c_1 \oplus d_0 \oplus d_2 \oplus d_3 = S_1$ $c_2 \oplus d_1 \oplus d_2 \oplus d_3 = S_2$ $c_0 = d_0 \oplus d_1 \oplus d_3$ $c_1 = d_0 \oplus d_2 \oplus d_3$ $c_2 = d_1 \oplus d_2 \oplus d_3$ 010001010100000100010
001000100101001000100
100100010000101000001
000001001001010101000 1
100010000010010001101 0
001010001000100011010 0

FIG. 3a

1 ERROR-SYNDROMES
14 01 22 04 30 09 02 05 28 03 10 0A 24 18 06 08 21 38 12 20 11 0C
2 ERRORS-SYNDROMES
15 23 26 34 39 0B 07 2D 2B 13 1A 2E 3C 1E 0E 29 19 2A 32 31 1D

1 ERROR = 01 02 15 12 08 11 0A 04 10
2 ERRORS = 03 17 07 1A 19 1B 0E 14
3 ERRORS = 16 05 0F 0B 13 1F 1E

FIG. 5a $$\begin{bmatrix} c_0 \\ c_1 \\ c_2 \\ c_3 \\ c_4 \\ c_5 \\ c_6 \\ d_0 \\ d_1 \\ \vdots \\ d_{22} \end{bmatrix}$$

FIG. 5b

| DATA BITS (k) | (TOTAL BITS, CHECK BITS) — (k+c,c) | | | |
|---|---|---|---|---|
| | SEC | DEC | DAEC | TAEC |
| 4 | (7,3) | (10,6) | (8,4) | (9,5) |
| 8 | (12,4) | (15,7) | (13,5) | (14,6) |
| 16 | (21,5) | (25,9) | (22,6) | (22,6) |
| 32 | (38,6) | (42,10) | (39,7) | (39,7) |
| 64 | (71,7) | (76,12) | (72,8) | (72,8) |

FIG. 6

| DATA BITS | PERCENTAGE SYNDROMES USED | | | |
|---|---|---|---|---|
| | SEC | DEC | DAEC | TAEC |
| 4 | 88% | 88% | 100% | 78% |
| 8 | 81% | 93% | 81% | 58% |
| 16 | 69% | 64% | 69% | 100% |
| 32 | 61% | 89% | 61% | 90% |
| 64 | 56% | 71% | 56% | 84% |

| SYNDROMES FOR SINGLE, DOUBLE, AND TRIPLE ERRORS ||||||||  DATA BIT TO INVERT |
|---|---|---|---|---|---|---|---|---|
| SINGLE | DOUBLE ||| TRIPLE ||||
| X | X-1<br>X | X<br>X+1 | X-2<br>X | X<br>X+2 | X-2<br>X-1<br>X | X-1<br>X<br>X+1 | X<br>X+1<br>X+2 | |
| 09 | – | 1B | – | 2D | – | – | 3F | $d_0$ |
| 12 | 1B | 36 | – | 53 | – | 3F | 77 | $d_1$ |
| 24 | 36 | 65 | 2D | 2F | 3F | 77 | 6E | $d_2$ |
| 41 | 65 | 4A | 53 | 54 | 77 | 6E | 5F | $d_3$ |
| 0B | 4A | 1E | 2F | 4F | 6E | 5F | 5A | $d_4$ |
| 15 | 1E | 51 | 54 | 37 | 5F | 5A | 73 | $d_5$ |
| 44 | 51 | 66 | 4F | 57 | 5A | 73 | 75 | $d_6$ |
| 22 | 66 | 31 | 37 | 4E | 73 | 75 | 5D | $d_7$ |
| 13 | 31 | 7F | 57 | 27 | 75 | 5D | 4B | $d_8$ |
| 6C | 7F | 58 | 4E | 1A | 5D | 4B | 2E | $d_9$ |
| 34 | 58 | 42 | 27 | 4D | 4B | 2E | 3B | $d_{10}$ |
| 76 | 42 | 0F | 1A | 35 | 2E | 3B | 4C | $d_{11}$ |
| 79 | 0F | 3A | 4D | 6F | 3B | 4C | 2C | $d_{12}$ |
| 43 | 3A | 55 | 35 | 2B | 4C | 2C | 3D | $d_{13}$ |
| 16 | 55 | 7E | 6F | – | 2C | 3D | – | $d_{14}$ |
| 68 | 7E | – | 2B | – | 3D | – | – | $d_{15}$ |

FIG. 9a $$c_0 = d_0 \oplus d_3 \oplus d_4 \oplus d_5 \oplus d_8 \oplus d_{12} \oplus d_{13}$$
$$c_1 = d_1 \oplus d_4 \oplus d_7 \oplus d_8 \oplus d_{11} \oplus d_{13} \oplus d_{14}$$
$$c_2 = d_2 \oplus d_5 \oplus d_6 \oplus d_9 \oplus d_{10} \oplus d_{11} \oplus d_{14}$$
$$c_3 = d_0 \oplus d_4 \oplus d_9 \oplus d_{12} \oplus d_{15}$$
$$c_4 = d_1 \oplus d_5 \oplus d_8 \oplus d_{10} \oplus d_{11} \oplus d_{12} \oplus d_{14}$$
$$c_5 = d_2 \oplus d_7 \oplus d_9 \oplus d_{10} \oplus d_{11} \oplus d_{12} \oplus d_{15}$$
$$c_6 = d_3 \oplus d_6 \oplus d_9 \oplus d_{11} \oplus d_{12} \oplus d_{13} \oplus d_{15}$$

FIG. 9b

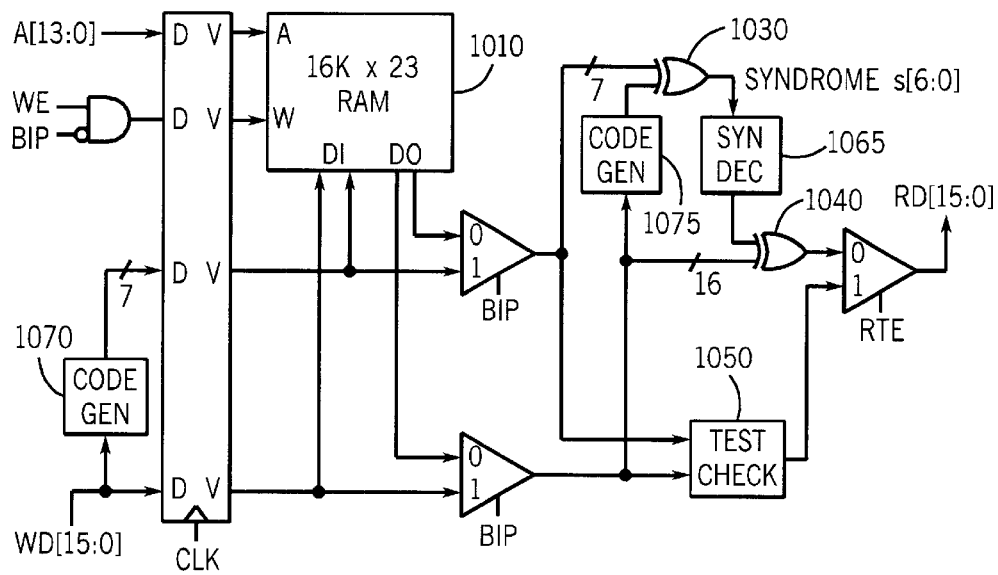

FIG. 11

| TEST CHECKER ||
|---|---|
| 23-BIT INPUT | 16-BIT OUTPUT |
| 000000 | 0000 |
| 555555 | 0001 |
| 2AAAAA | 0002 |
| 7FFFFF | 0003 |
| OTHER | FFFF |

FIG. 12

| CHECK BITS FOR RAM TEST ||
|---|---|
| d[15:0] IN | c[6:0] OUT |
| 0000 | 00 |
| 5555 | 2A |
| AAAA | 55 |
| FFFF | 7F |

FIG. 14

BLOCK CODE TO EFFICIENTLY CORRECT ADJACENT DATA AND/OR CHECK BIT ERRORS

BACKGROUND OF THE INVENTION

1. Field of the Invention

The present invention relates to a block code for efficiently correcting adjacent data and/or check bit errors. In particular, the present invention relates to a block code for avionics systems, where the block code corrects for adjacent or almost-adjacent errors that may be caused, for example, by the neutron single event upset (NSEU) problem that may occur at high altitudes.

2. Description of the Related Art

Error detection and correction techniques can provide efficient recovery of data that may have been corrupted for various reasons. For example, data can be corrupted by :perturbations in the communications channel through which the data was sent from a source to a destination, and by errors related to the storing of data in memories.

Error detection or identification can be performed in many ways, all of them involving some form of coding. See, for example, S. Lin and D. Costello, Jr., "Error Control Coding: Fundamentals and Applications", Prentice-Half, Inc., Englewood Cliffs, N.J., 1983 (Pages 1–5; 85–116). The simplest form of error detection is an added parity bit. Multiple parity bits cannot only detect that an error has occurred, but also which bits have been inverted. These bits can be re-inverted to restore the original data. Additional parity bits increase the chance that multiple errors will be detected and corrected.

Engineers and designers use error-detection and error-correction to provide reliable data transmission. Typical examples of such techniques are: parity checking, cyclic redundancy check (CRC), and Hamming codes.

Parity checking is a conventional error-detection technique. Each unit of data is written with an extra single "parity" bit. An even number of 1's (or 0's) are written in the data and parity bits, to achieve "even" parity. Alternatively, an odd number of 1's (or 0's) are written in the data and parity bits, to achieve "odd" parity. Parity checking provides a minimal overhead solution to provide error detection of semiconductor memory. There are many variations of this technique, e.g., even-parity, odd-parity, and horizontal-and-vertical parity checking. Parity checking does not provide error correction, however.

Check summing provides a unique value computed from a group of data. After, transmission of data, the check sum can be re-computed and compared to the transmitted, original check sum value. See, for example, D. P. Siewiorek and R. S. Swarz, "The Theory and Practice of Reliable System Design", Digital Press, 1982 (Pages 94–98). A mismatch indicates that an error has occurred in the transmitted data. Parity checking provides error detection of each data word. Instead of validating each individual data word, check sums only indicate an error in the entire transmitted or accessed data.

Another way to check for bit errors is CRC, which is more appropriate for burst errors. Circuitry (or software) cyclically shifts a code word to produce another code word. Devices to implement these codes are implemented using linear feedback shift registers (exclusive-or gates and memory elements). Cyclic codes detect all single errors in a code word, burst errors (multiple adjacent faults), and other error patterns. These codes are typically used in sequential-access devices and data transmission links. Details on cyclic codes may be found in the S. Lin et al. reference, discussed above.

Hamming is a well-known name in the field of data encoding and decoding. See, for example, the D. P. Siewiorek and Swarz reference pages 122–133. The Hamming code system provides an easy way to identify and correct errors in data bits. To encode binary data, redundant bits are added to produce a longer word. These check bits are combined with the data bits and are considered an integral part of the word. As such, either data bits or parity check bits, or both, can be in error in the transmission process.

The term "Hamming distance" refers to the number of single bit errors possible between two codewords. To detect d bit errors, the code needs a d+1 Hamming distance. To correct d bit errors, the code needs a 2d+1 Hamming distance. A single parity bit has a Hamming distance of 2, and can therefore detect 1-bit errors.

FIG. 1a shows the parity-check matrix for a (7,3) Hamming Single Error Correcting (SEC) code, where the value 7 signifies the total code word size, and the value 3 signifies the number of check bits in the code word. This parity check matrix was originally proposed by Hamming in the 1950's, as given in the above-mentioned article. Circuitry decodes a seven-bit word by forming the dot product with the matrix. FIG. 1b shows the resulting exclusive-or (XOR) parity-tree equations for computing the syndrome bits $S0$, $S1$, $S2$, and FIG. 1c shows the relationship of the check bits $c0$ through $c2$ and the data bits $d0$ through $d3$. With the seven-bit word, the matrix product of the (3×7) block code matrix and the (7×1) codeword produces a three-bit vector call the syndrome. If the syndrome contains all 0s, no detectable error is present. If a single bit error exists in the word of data, the syndrome value will match the check-matrix column corresponding to the bit in error.

The SEC Hamming matrix does not correct or detect multiple bit errors. As an example of a two-bit error, consider $d1$ and $d2$ being invalid. Using the equations of FIG. 1b, the syndrome is calculated to be equal to (1,1,0). This matches the third column of the matrix, and incorrectly indicates that $d0$ is invalid.

As is well known to those skilled in the art, semiconductor memories are being made with increasing memory densities, in order to obtain larger memory capacities using the same semiconductor substrate area. Innovations in semiconductor memory fabrication have allowed for such increased memory densities. While this is of course a good feature in general, those in the avionics and space industry have discovered a detrimental side effect to increasing memory densities. At high altitudes without a protective atmosphere layer, energetic particles cause discharges in semiconductor memories. See, for example, S. Buol, "Neutron-Induced Single Event Upset or NSEU", Rockwell Collins Presentation, GenAv FCC Hardware Engineering, April, 1998; J. Olsen et al., "Neutron-Induced Single Event. Upsets in Static RAMS Observed in 10 KM Flight Altitude, IEEE transactions on Nuclear Science, Vol. 40, no. 2, April, 1993. With decreasing lithography sizes, these discharges are causing multiple bit failures. These failures will increase with the introduction of denser commodity memory parts in avionics products.

Thus, there is a need for an efficient error detection and correction scheme. Further, there is a need for an error correction scheme that is not too complex and that can handle errors that occur due to NSEU events.

SUMMARY OF THE INVENTION

It is an object of the present invention to provide an error correction scheme that corrects physically localized errors like those that occur due to NSEU events, where those errors occur in adjacent or almost-adjacent locations of a code word.

The above-mentioned object and other advantages may be obtained by a first method of error correction. That method includes a step of providing a block code matrix such that an exclusive-or value of any: two adjacent columns of the block code: matrix and corresponding values representative of data disposed in each column are unique with respect to each other. That method also includes a step of computing a syndrome of a codeword using the block code matrix, and correcting for any single errors and any double-adjacent errors based on the computed syndrome.

The above-mentioned objects and other advantages may also be obtained by a second method of error correction. That method includes a step of providing a block code matrix wherein an exclusive-or value of any two adjacent columns of the block code matrix, an exclusive-or value of any three-adjacent columns, and a value corresponding to a numeric representation of each column are unique with respect to each other. That method also includes a step of computing a syndrome of a codeword using the block code matrix, and correcting for any single errors, any double-adjacent errors, and any triple-adjacent errors based on the computed syndrome.

The above-mentioned objects and other advantages may also be achieved by a program configured to be run on a processor and configured to provide error correction. The program includes a program code unit for computing a block code matrix of a predetermined number of columns and a predetermined number of rows, such that an array of bits in each of the columns is unique: :with respect to other columns, and such that an exclusive-or value of corresponding bits in each adjacent column is unique with respect to each other and with respect to each of the columns.

BRIEF DESCRIPTION OF THE DRAWINGS

The above-mentioned object and advantages of the invention will become more fully apparent from the following detailed description when read in conjunction with the accompanying drawing's, with like reference numerals indicating corresponding parts throughout, and wherein:

FIG. 3a shows a (22,6) DAEC block code matrix according to a first embodiment of the invention;

FIG. 3b shows the syndrome values used to correct single errors and double errors using the DAEC code;

FIG. 4a shows a (9,4) TAEC code matrix according to a second embodiment of the invention;

FIG. 4b shows the syndrome values used to correct single. errors and double errors using the (9,4) TAEC code;

FIG. 5a shows a (39,7) TAEC code matrix according to a second embodiment of the invention;

FIG. 5b shows one possible sequence of data bits and check bits for the (39,7) TAEC code according to the second embodiment;

FIG. 6 provides a comparison of check bits and data bits required for different types of error correction codes;

FIG. 9a lists the unique syndromes for determining either single errors, double-adjacent errors, double-almost-adjacent errors, and triple-adjacent errors according to a third embodiment of the invention;

FIG. 9b shows the relationships for computing the 7 check bits based on the 16 data bits of a (23,7) block code that can be used according to the third embodiment;

FIG. 11 shows details of the RAM block of FIG. 10;

FIG. 12 lists test checker values used in a BIST according to the fourth embodiment of the invention;

FIG. 14 lists the check bits used for RAM built-in-self test according to the fourth embodiment of the invention;

DETAILED DESCRIPTION OF THE PREFERRED EMBODIMENTS

The present invention utilizes the physical characteristics of NSEUs in order to create a more efficient encoding scheme as compared to conventional error correction schemes.

Figures 1A, 1B, 1C, 2:
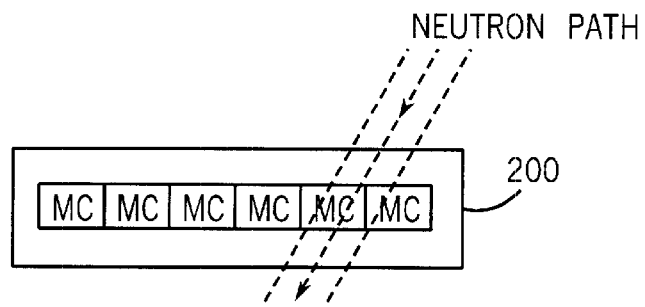
FIG. 1a shows a block code matrix for a conventional (7,3) SEC Hamming code.
FIG. 1b shows the relationship between the syndrome bits and the data and check bits for the (7,3) SEC Hamming code.
FIG. 1c shows the relationship between the check bits and the data bits for the (7,3) SEC Hamming code.
FIG. 2 shows an NSEU event that affects a particular region of a semiconductor memory.

As discussed In an earlier section, NSEUs are of particular concern to the avionics and space industries, due to the lack of a protective atmospheric layer at high altitudes. A heavy ion particle traversing a semiconductor device can deposit sufficient charge to cause a memory bit to be flipped or to cause a transient error. See, for example, "Using Heavy-Ion Radiation to Validate Fault Handling Mechanisms," IEEE Micro. Vol. 14, pp. 4–23, February, 1994. These random, single-event upsets (SEUS) in semiconductor memory occur at an increased rate in high altitudes than on the ground. See, e.g., the Fries et al. article or the Olsen et al. article, referenced earlier. SEUs are transient and non-destructive, but can cause a loss of data if left uncorrected. See J. Sosnowski, "Transient Fault Tolerance in Digital Systems". IEEE Micro, Vol. 14, pp. 24–35, February, 1994. SPUs are often associated with neutrons in the upper atmosphere. Neutron SEUs occur as a neutron passes through a nuclear region with the substrate. FIG. 2 shows an NSEU event that affects the two rightmost memory calls MC. FIG. 2 has been adapted from a web page furnished by Space Radiation Associates.

Until recently, an event upset typically affected only a single memory cell. With decreasing circuit lithography dimensions, the avionics industry is becoming concerned that SEUs will affect multiple memory cells. See the Buol article, referenced earlier. The physical characteristics of the SEU (e.g., depth, cross-section, and funnel) have not changed, but memory cell dimensions have been reduced by one-half about every eighteen months or so for about the past twenty years. A single SEU can potentially affect a semiconductor region containing several memory cells. As such, traditional single error correction (SEC) codes, such as the Hamming code discussed in a previous section, are not effective for correcting these multiple errors.

As discussed previously, parity checking provides for error detection of each data word, but does not provide error correction. Instead of validating each individual data, check sums only indicate an error in the entire transmitted or accessed data. As mentioned above, NSEUs can corrupt the memories, such as an on-chip memory of a microprocessor. These errors can affect parts of memory not active with the executing microprocessor. When an NSEU is detected with a checksum calculation, typically a reboot of the microprocessor system is required. Occasionally, several hours .or days of data can be corrupted and lost before this is done. Other error detection/correction schemes, such as CRC, can circumvent this problem, but they are complex and require many overhead bits.

As discussed earlier with respect to the (7,3) Hamming SEC code, when a two-bit error due to data bit d1 and data bit d2 occurs, the syndrome (1,1,0) is computed, which matches the third column of the block code matrix, and thereby incorrectly indicates that data bit d0 is invalid. Due to the increasingly-small memory densities, having errors occur in adjacent memory cells, such as a memory cell storing data for data bit d1 and a memory cell storing data for data bit d2, can occur due to a single NSEU that affects both memory cells. The NSEU causes a discharging of a memory cell that it passes through, so that, if data bit d1 and data bit d2 were both originally set to a logic '1' value in a semiconductor memory, an NSEU that passes through a region of the memory that includes both memory cells would cause both memory cells to discharge to a logic '0' value. Of course, if only one of the data bits, say data bit d1, was set to a logic '1' value, then the NSEU that passes through both memory cells would discharge both, but since the memory cell storing data bit d0 was previously set to a logic '0' value, this would not affect that bit, and so only a single memory cell would be corrupted in that instance. In the example provided in FIGS. 1a–1c, it has been found that the resulting syndrome from the Hamming equations is the exclusive-or (xor) of the two failing columns, that being (1,0,1) xor (0,1,1)=(1,1,0). For SEC codes, this does not provide a unique condition, but the realization that adjacent errors always produce a syndrome that is the xor of the Hamming columns in error is a feature used in developing the embodiments of the present invention. The present invention provides for unique syndrome values to allow for correction of single errors and adjacent errors that may occur due to NSEU events.

Various techniques are possible to correct the multiple errors that are caused by NSEUs in dense commercial memories. An important criterion for correcting errors due to NSEUs is that NSEUs cause adjacent errors. See the Buol article, referenced earlier. SEU cross section analysis also appears to support this assertion. See the H. Garrett et al. article, referenced earlier. As such, one option to address the adjacent bit errors caused by NSEUs is to physically interlace the bits of multiple words with respect to where they are stored in a memory chip. NSEUs will affect adjacent physical bits that are contained in different correctable memory words. Single bit error correction (SEC) codes can correct the single bit errors of each word. This is a viable solution; however, it does imply that portions of each NSEU error are left uncorrected. This increases the likelihood that additional NSEUs could further degrade words that have remaining uncorrected errors. Also, interlacing the words may not be supportable with standard mega-cell memory designs. In addition, a custom interlaced memory cell design may not be a financially viable alternative.

As discussed earlier, cyclic redundancy codes offer a technique to correct burst errors in serial transmissions. Such codes are relatively complex to create and to decode, however. The present invention provides for correction of adjacent and almost-adjacent errors (see third embodiment) by using a unique block code which has some similarities to a Hamming code. The discussion below provides an overview of conventional Hamming code correction schemes, and extends those techniques to correct adjacent and almost-adjacent errors that may occur in semiconductor memories due to NSEUs, according to the present invention.

For a Hamming code that provides single error correction, consider a code with k data bits and c check bits. The code must represent $2^k$ binary values. The code word contains k+c bit positions that could have a single bit error. Including the set of correct values, there are k+c+1 sets of $2^k$ binary values that must be represented in the k+c code word. This implies $$2^k\{k+c+1\}=2^{k+c} \tag{1}$$

because there must be more code word values than the total number of valid and detectable incorrect binary values. Eliminating the common $2^k$ term from both sides of the equation (1) produces the more common form of this relationship:

$$k+c+1=2^c \tag{2}$$

Equation (2) reveals that there is a logarithmic relationship between the number of data bits and check bits in the Hamming codes. The (7,3) Hamming code, discussed earlier, meets this equation, since 4+3+1=8

Parity checking is an important concept of error checking approaches. It is straightforward to add double error detection (DED) to the previously-described single error correction (SEC) code. An additional parity line is added to the matrix in order to provide for double error detection. This produces a parity tree to validate that each syndrome produced is valid. The extra check bit and the additional circuitry identifies invalid syndromes, and also identifies all double errors. See, for example, the D. Siewiorek et al. reference, discussed earlier. This approach can be used to extend any Hamming code to provide an additional level of error detection. Additional details of this concept are not provided herein; however, the basic concept is that a single additional bit can always provide an additional level of error detection, even for the code according to the present invention.

Double error correction (DEC) codes are also known. These codes consider all permutations of double bit errors and result in a significant increase in parity check bits. Consider, as an example, an error correction code with k data bits and c check bits. Again, this code must represent $2^k$ binary values. The code word contains k+c bit positions that could have a single bit error. The code word must also represent the full set of permutations of two bit errors. Including the set of correct values, the single bit errors, and the double bit errors, the following equation can be derived:

$$2^k\{(k+c)+(k+c)!/(2!(k+c-2)!)+1\}=2^{k+c} \tag{3}$$

Again, there must be more code word values than the total count of valid and detectable incorrect binary values. Eliminating the common $2^k$ term from both sides and expanding the permutation of equation (3) yields the simpler equation:

$$(k+c)^2+(k+c)+2=2^{c+1} \qquad (4)$$

The squared term of equation (4) signifies that many more check bits than the SEC will be required to provide double bit correction on large word sizes.

A first embodiment of the present invention will now be described. The present invention utilizes the physical characteristics of NSEU errors in semiconductor memories to provide a more efficient code that is tailored to correcting such errors. The present invention is premised on the fact that one does not have to consider all permutations of double bit errors, since NSEU errors will typically affect physically adjacent or almost-adjacent memory cells. Consider a block code with k data bits and c check bits. Again, this code must represent $2^k$ binary values.

The code word contains k+c bit positions that could have a single bit error. The code word contains only k+c−1 positions for double adjacent bit errors. Including the set of correct values, the single bit errors, and the double adjacent bit errors, we obtain the following equation:

$$2^k\{(k+c)+(k+c-1)+1\}=2^{k+c} \qquad (5)$$

Again, there must be more code words than total number of valid and detectable incorrect binary values. Eliminating the common $2^k$ term from both sides of equation (5) yields the simpler equation:

$$k+c=2^{c-1} \qquad (6)$$

This implies that approximately one more check bit than what is required for SEC will be required to provide double adjacent error correction (DAEC) capability.

An example of a DAEC code according to the first embodiment of the invention is provided herein below. Sixteen bit microprocessors are not uncommon In current avionics platforms, and in the near future thirty-two bit (or greater) microprocessors may be utilized in avionics platforms. High altitude flights will experience double adjacent errors in high-density commodity semiconductor memories provided on those avionics platforms. FIG. 3a illustrates a twenty-two (22) column block code matrix to provide double adjacent error correction (DAEC). As with a single error correction scheme, each column is unique. However, the block code matrix according to the first embodiment has a characteristic in that the exclusive-ors of adjacent columns are unique to each other and to each column itself. FIG. 3b shows the syndrome values that identify the column, or the adjacent columns, in error. The hexadecimal (hex) values of the one-bit error syndromes match the columns of the matrix. The hex values of the two bit adjacent error syndromes match the exclusive-or of the adjacent columns of the matrix.

A feature of the block code matrix according to the first embodiment is the uniqueness of the syndromes, or the exclusive-ors, of individual columns and of adjacent columns. With this uniqueness, a single error or a double-adjacent-error in any particular location of a data word can be corrected according to the first embodiment of the invention. Thus, for example, if the syndrome 15 was computed, then an error at the first and second bit positions would be determined. Those bit positions are then inverted in order to correct them.

A second embodiment of the present invention will now be described. As discussed earlier, high density semiconductor memories may result in two or more adjacent memory cells to be affected by a single NSEU event. Referring back to FIG. 2, a single neutron n that passes through a semiconductor memory may pass through the silicon layer and cause a region of discharge. That region of discharge corresponds to a spatially contiguous region of the semiconductor memory, and may include more than one memory cell. While the DAEC code is useful in correcting double adjacent errors, there is a possibility that three adjacently—positioned memory cells could be affected by a single NSEU event. This is because decreasing lithography dimensions (sub-micron size) increases the number of memory cells affected. As with double adjacent error correction code analysis, the second embodiment is characterized in that it does not consider all permutations of triple bit errors, but instead it considers only the adjacent ones. There are k+c−2 positions where triple adjacent errors can occur in a k+c word of memory. Based on that, the following equation can be derived:

$$2^k\{(k+c)+(k+c-1)+(k+c-2)+1\}=2^{k+c} \qquad (7)$$

Again, the common 2k term is eliminated from both sides of equation (7) to yield the following simpler equation:

$$3*(k+c)-2=2^c \qquad (8)$$

Compared to the DAEC codes of the first embodiment, only a fraction more of check bit is required to support triple adjacent error correction (TAEC). At times, TAEC can be provided without an additional check bit over DAEC. Analysis has shown that TAEC codes reduce memory requirements for 32-bit words by about 15% as compared to a fully random triple error correction code, which requires more overhead bits.

Two examples of a TAEC code according to the second embodiment of the invention is provided herein below. As a first example, consider a (9,5) TAEC code having a block code matrix as given in FIG. 4a. This provides a triple-adjacent error correction for a four-bit word. From the analysis given previously, five check bits are required to identify and correct all single, double adjacent, and triple adjacent errors. The matrix in FIG. 4a is a (k+c)×(c) matrix, where c is the number of check bits, and k is the number of data bits. As with a single error correction code, each column of the (9,5) TAEC code is unique. However, the matrix also has the characteristic that the exclusive-ors of double-adjacent columns, as well as triple-adjacent columns, are unique with respect to each other and with respect to the individual columns. These unique exclusive-or values are provided in FIG. 4b. The hex values of the one-bit error syndromes match the columns of the block code matrix of FIG. 3a. The hex values of the two- and three-bit error syndromes match the xor of the double-adjacent and triple-adjacent columns of the block code matrix, respectively. Thus, if a syndrome has been calculated to be 14hex, then it is determined that the eighth and ninth bit positions of the nine-bit codeword are in error (double-adjacent error), and those bits are inverted to correct those errors. If a syndrome has been calculated to be 0Fhex, then it is determined that the third, fourth and fifth bit positions are in error (triple-adjacent error), and those bits are inverted to correct those errors.

Figures 5A, 5B, 6:
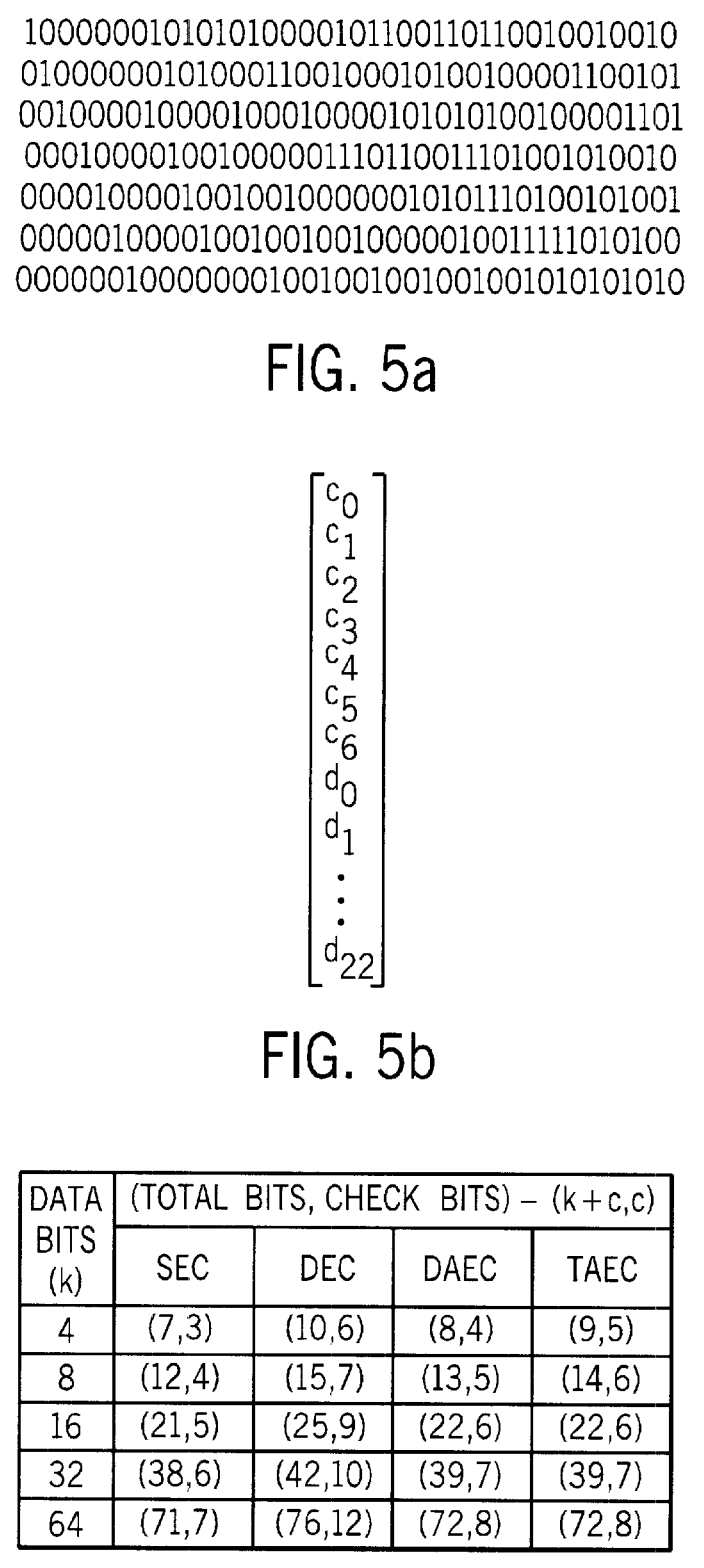

A second, more practical example of a TAEC code is provided herein below. The block code matrix for a (39,7) TAEC code according to the second embodiment of the invention is given in FIG. 5a. This provides a triple adjacent error correction for a thirty-two bit word. FIG. 5a shows a thirty-nine column by seven row block code matrix, where all columns are unique, and the xors of double-adjacent and triple-adjacent columns are unique. Syndromes are found using a dot product of the matrix and the check and data bits. Check bits are typically assigned to columns with a single one in them. Thus, in FIG. 5a, the first through seventh columns may correspond to check bits c0 to c6 of the (39,7) TAEC code.

Using equations or circuitry developed with the block code matrix, the computed syndrome can identify and correct single, double adjacent, and triple-adjacent errors. FIG. 5b shows a 39×1 matrix that corresponds to the thirty-nine bit codeword that is to be error-corrected using the block code matrix of FIG. 5a. That codeword is matrix-multiplied by the 7×39 block code matrix, to create a (7×39)×(39×1)= 7×1 matrix that corresponds to the 7-bit syndrome. Once the syndrome is computed, if it is nonzero, the syndrome value is used to correct any single error, double-adjacent errors, or triple-adjacent errors. For example, if a syndrome value of 07hex is computed, that would correspond to the xor of the first, second and third columns (07hex=00000111 in binary representation), signifying that a triple-adjacent error at the first, second and third bit positions of the thirty-nine bit codeword were detected. These bits can then be inverted to output a corrected codeword. Since the 07hex value is unique to any single column, the xor of any two adjacent columns, or the xor of any three adjacent columns, the present invention provides a way to detect and correct for triple-adjacent errors.

While the (39,7) example was given for a block code matrix that had the seven check bits in the first seven bit positions, one of ordinary skill in the art will recognize that the check bits and the data bits can be placed in any particular position and not just in the manner shown in FIG. 5b, while remaining within the scope of the invention as provided herein. For example, the conventional SEC Hamming code shown in FIG. 1a provides an example where the check bits c0, c1 and c2 are located in the first, second and fourth bit positions of the seven-bit codeword; other locations are possible with that codeword or with a DAEC or TAEC codeword according to the invention.

A summary of the total bits and check bits required for typical memory size words is provided in FIG. 6. The DAEC always requires one more parity check bit than SEC, which is a small price to pay for obtaining double-adjacent error correction. Also, the TAEC codewords often do not require any more check bits than a comparable DAEC codeword, as can be seen in the 16, 32 and 64 data bit examples given in FIG. 6.

Figures 7, 8:
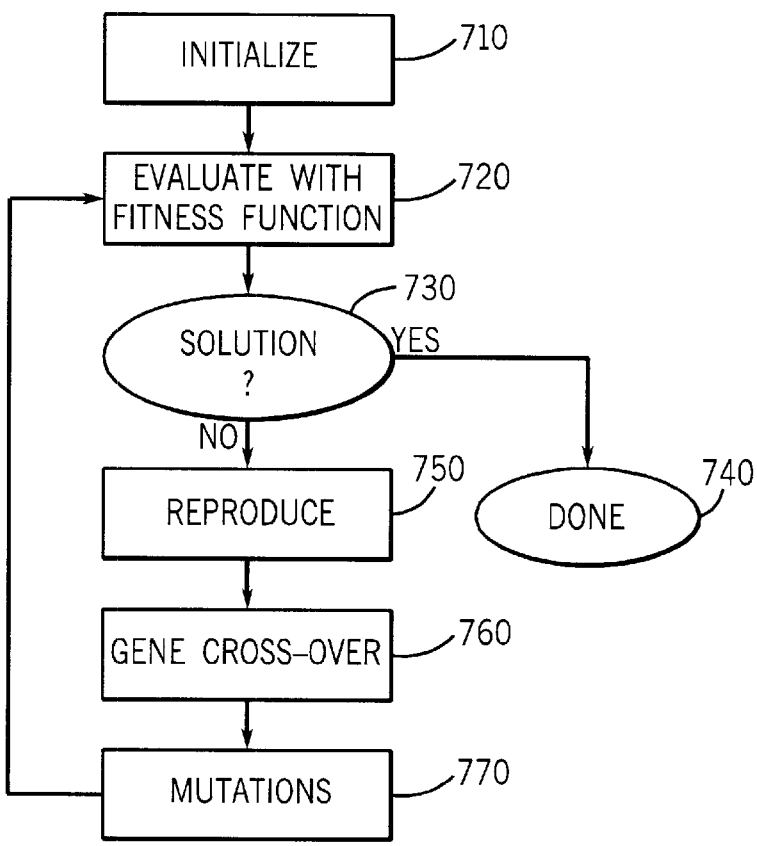
FIG. 7 shows the percentage of syndromes used for the different types of error correction codes listed in FIG. 6.
FIG. 8 is a flow chart of a genetic algorithm that can be used to compute a block code matrix according to the invention.

Creating the Hamming matrix for an SEC code is relatively straightforward. Any matrix will work as long as no two columns are alike and no column is all zeros (0s). Different matrices can provide optimizations to reduce encoding circuitry or delays. With the SEC encoding, there is a one-to-one relationship between the syndromes and the data word column in error. With the DAEC and TAEC encoding, however, syndromes also indicate which adjacent columns are in error. This implies that a more complex mapping scheme is required for the block code matrix of a DAEC or TAEC code. It also implies that more of the available $2^c$ syndromes (c check bits) are being used. FIG. 7 shows the percentage of syndromes being used for each of the encoding schemes. FIG. 7 shows that some typical mappings will use all of the syndromes, such as 4-data bit DAEC and 16-data bit TAEC. As such, having no spare syndromes can make the implementation of the DAEC and TAEC matrices a not-so-simple procedure.

The rules for providing a block code matrix according to either the first or the second embodiments are provided below. As discussed with reference to SEC codewords, a Hamming code syndrome matches and identifies the column and bit position in error. The previous analysis intentionally identified a double-adjacent error that was not correctable by an SEC code. In that example, it was found that the resulting syndrome from the Hamming equation was the xor of the two failing columns. For an SEC code, however, this is not a unique condition, and adjacent errors always produce a syndrome that is the xor of the Hamming columns in error. For example, FIGS. 1a and 1b show that the (1,1,0) syndrome corresponds to the third column of the SEC block code matrix, thereby resulting in the incorrect determination that bit d0 (the third bit in the seven-bit codeword) is in error.

The present invention provides for a unique condition for every possible single error, double-adjacent error and triple-adjacent error event. A set of rules provides the guidelines to develop block code matrices that can correct double- and triple-adjacent errors.

Rule 1: Identify a unique set of syndromes to identify the column bits in error, the double-adjacent columns in error, and (if TAEC is to be performed,) the triple-adjacent columns in error.

Rule 2: Compute the double and triple error syndrome value by exclusive or'ing values of the corresponding single bit column's syndrome values.

Rule 3: Ensure that no duplicate syndromes exist for the single, double-adjacent, and (if TAEC is to be performed) triple-adjacent errors.

For large codewords, the development of the block code matrices that meet the three rules provided above may be made by various methods, such as an exhaustive (or depth first) tree search approach, or by the use of genetic algorithm software.

The equations for determining DAEC and TAEC codes (see equations 6 and 8) did not account for any constraints from unique syndromes from with exclusive ors. Those equations provide an absolute lower bound. An exhaustive tree search proves that the additional constraints can potentially raise that lower bound.

It is possible to build a block code matrix using a software tree-searching algorithm. The genetic algorithm approach produces and evaluates multiple copies of the entire matrix. In contrast, a depth-first tree-searching algorithm will generate and evaluate partially completed matrices. The same set of rules are used with both approaches to evaluate the validity of the matrix—all columns must be unique, exclusive ors of the columns must be unique, etc. Depth-first searching algorithms are well understood and significant literature exists in computer science and artificial intelligence literature.

Figure 15:
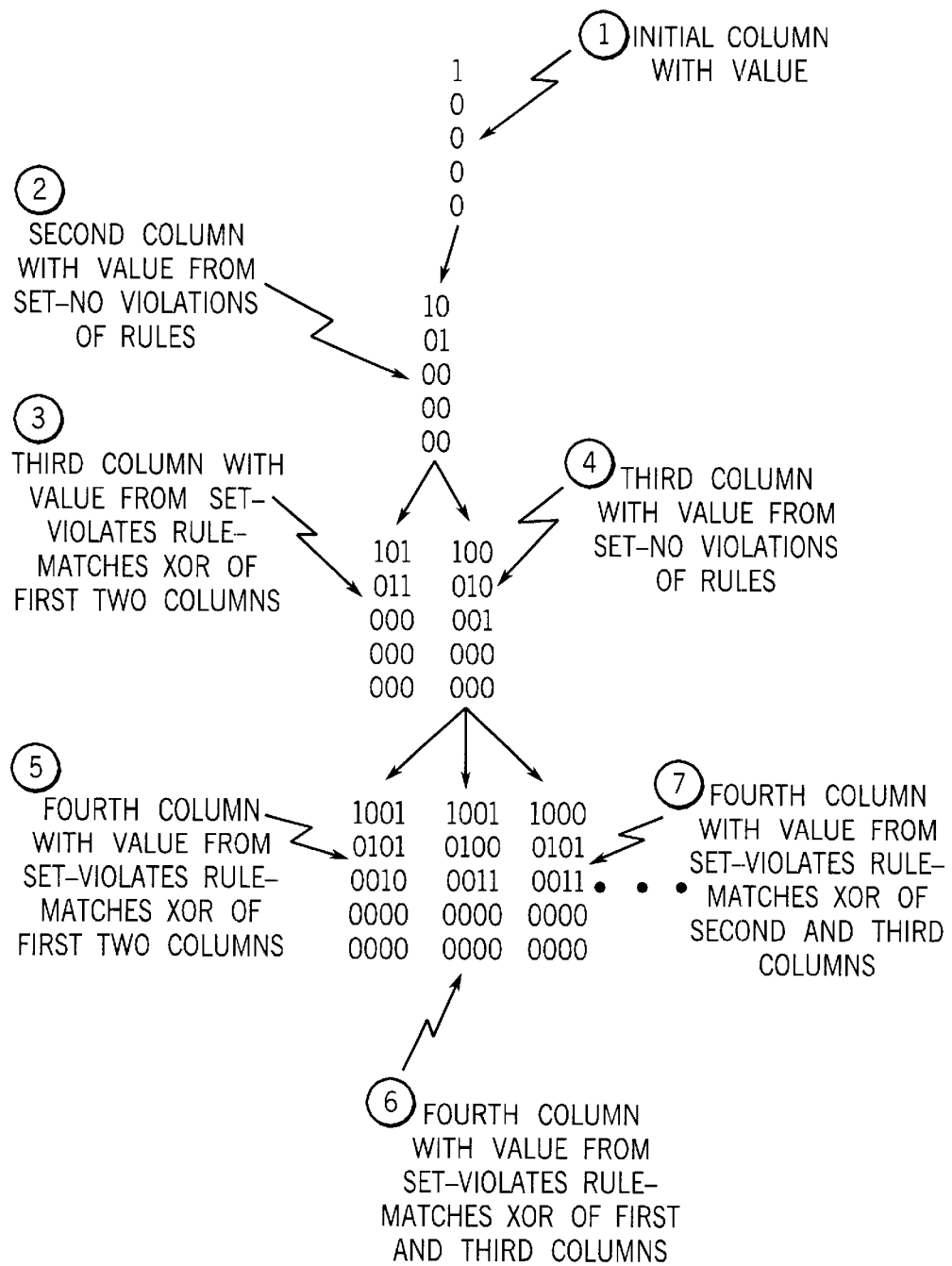
FIG. 15 is a diagram showing how a block code matrix according to the invention can be formed using a depth-first tree-searching algorithm.
Figure 16:
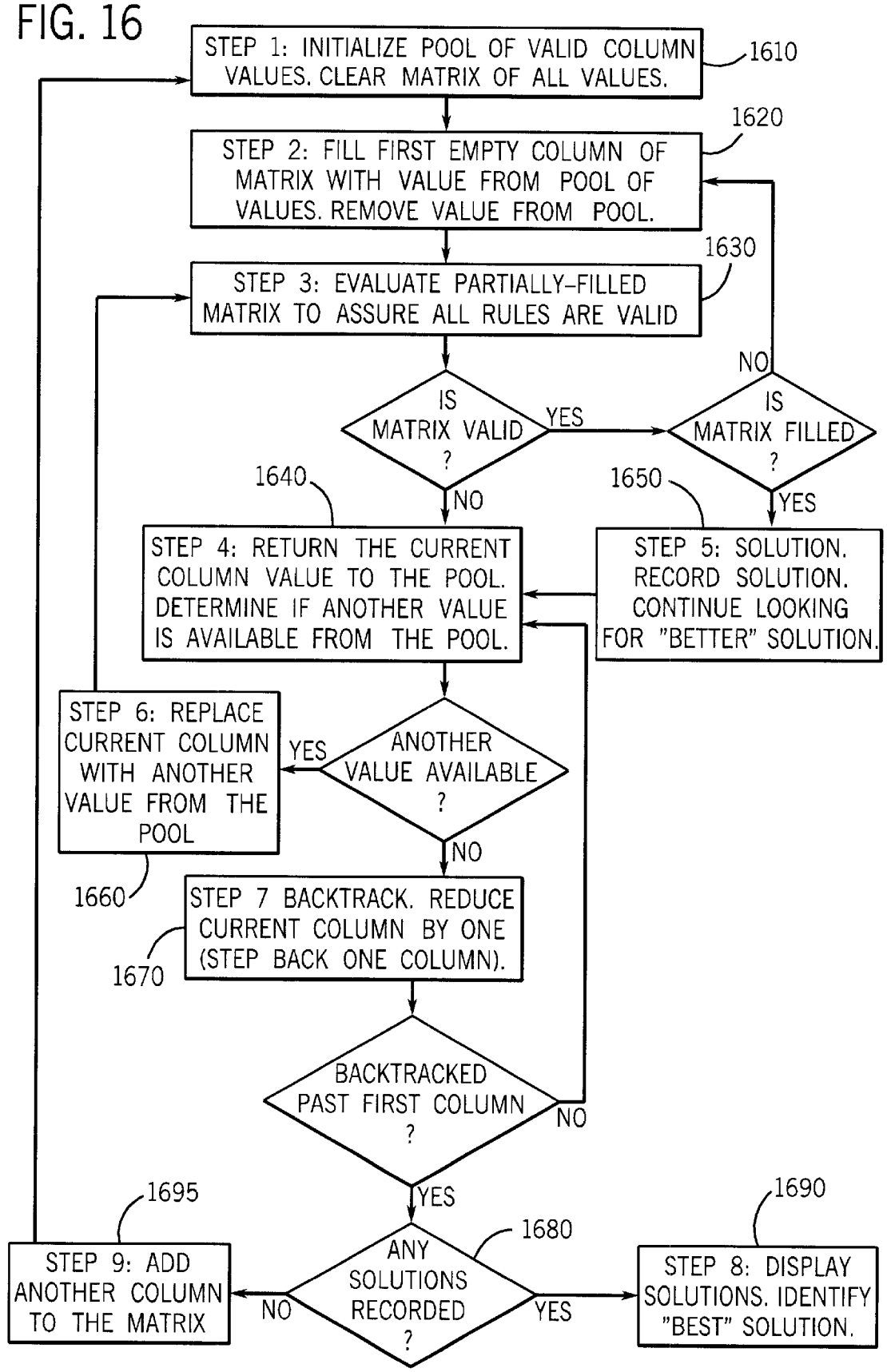
FIG. 16 is a flow chart of a depth-first tree-searching algorithm that has been adapted to search for a block code matrix that can be used according to the invention.

FIG. 15 illustrates generation of a block code matrix according to the invention utilizing the depth-first tree-searching algorithm, and FIG. 16 is a flow chart of the steps involved in the depth-first tree-searching algorithm that is adapted to provide a block code matrix according to the invention. In a step 1610, an initialization is made of a pool of valid column values, and a clearing a matrix of all values is performed. In a step 1620, the first empty column of the block code matrix is filled with a column value from the set of all remaining column values, and that column value is removed from the pool of valid column values. In a step 1630, an evaluation is made of the partially-filled matrix to assure that no rules are violated. If the matrix is valid and not completely filled, the algorithm returns to step 1620 to continue to fill the matrix. If the matrix is valid and the matrix is completely filled, the algorithm goes to a step 1650, in which a solution is determined to have been found. The algorithm may then end, or the algorithm can be configured to then go to step 1640 to continue looking for a better solution, if desired. If the matrix is not valid, in a step 1640, the algorithm returns the current column value to the pool. If another value remains in the pool, in a step 1660, the current column is replaced with that value from the pool, and the algorithm returns to step 1630. If no valid values remain in the pool, in a step 1670 a backtracking is performed by reducing the current column by one and then returning to step 1640. If the backtracking has backtracked past the first column, then: it is determined if any solutions have been recorded in a step 1680, and those solutions (if any) are displayed in a step 1690. If no solutions have been recorded, then another column is added to the matrix in a step 1695, and the algorithm returns to step 1610 to start the algorithm over again with another initialization of a pool of valid column values.

FIG. 15 shows an implementation of the steps of FIG. 16 to create a block code matrix according to the depth-first tree-searching algorithm. This form of searching can take N! (N factorial) steps for N columns. Heuristics can help guide the selection of columns and speed the algorithm convergence to a solution.

Besides using exhaustive tree searches, genetic algorithm software may be utilized to discover the block code matrices that meet the rules provided above. One such genetic search algorithm is the Simple Genetic Algorithm (SGA), developed by H. Homer, as part of his doctoral research at the Vienna University of Economics. FIG. 8 is a flow chart for explaining the genetic algorithm. This algorithm provides paths in a search space to find solutions to complex problems. See, for example, J.-S. R. Jang, et al, "Neuro-Fuzzy and Soft Computing", Upper Sadde River, N.J., published by Prentice Hall 1997, (Pages 175–180). These algorithms mimic the theory that nature selects parents from a pool of a population based on the survival of the fittest criteria. The software utilized to determine block code matrices for DAEC and TAEC codes can perform the same selection using a fitness function (e.g., the three rules provided above).

The creation of a block code matrix can be done by a trial-and-error approach, or by the use of a simple fitness function to reflect the number of duplicate syndromes (or columns) in each block code matrix. The genetic algorithm software creates DAEC and TAEC matrices without the need for trial-and-error or manual iterations.

In FIG. 8, at a step 710, an initialization is performed with a random population, such as a petrie dish full of microorganisms that are to be subject to a particular dosage of radiation. At a step 720, the population is analyzed with respect to a fitness function. For example, after the radiation is applied, a determination is made as to the number of microorganisms that have survived. If a solution exists, as determined at a step 730, then the process is complete, as given in step 740. If a solution does not exist, then a reproduce step if provided in step 750. For example, if the total number of surviving microorganisms meet or exceed a particular percentage, then a solution is deemed to exist, and the process ends. However, if the total number of surviving microorganisms do note meet or exceed the particular percentage, then the microorganisms are allowed to reproduce, where the microorganisms exchange genes to provide a cross-over of genes for the next generation of microorganisms, as given in step 760. The mutated offspring are created in the step 770, and the process goes back to step 720, where the radiation is re-applied to determine the affects on the new generation of microorganisms (that includes some mutated microorganisms). This process is continued until a mutation is found (if at all) that is fairly resistant to the radiation.

For the present invention, the "genes" represent the block code matrix. Each gene contains a set of integer alleles to represent each of the columns in the matrix. As an example, the (22,6) DAEC code in FIG. 3a was developed using a system with 22 alleles. The fitness function used the twenty-two columns to compute the number of duplicate syndromes in the code. The genetic algorithm found syndromes to identify SEC and DAEC errors in the code. Other experiments were made with different fitness functions on long running algorithms, which provided matrices for TAEC codes. It was found that simpler fitness functions provided quicker solutions.

A third embodiment of the invention is provided in detail below. This embodiment provides for single error correction, double-adjacent error correction, triple-adjacent error correction, as well as double-almost-adjacent error correction. As discussed in detail previously, NSEUs occur at high altitudes from energetic particles discharging small regions of semiconductor memory, where these small regions may include more than one memory cell, due to decreases in lithography dimensions. For a case where a single NSEU event affects three contiguous memory cells, consider the case where only the first and third memory cells are charged with a logic "1" value, while the middle memory cell is not charged and thus holds a logic "0" value. In that instance, the single NSEU event discharges all three memory cells, but, since the second (or middle) memory cell did not hold a charge to begin with, an error would only occur in the first and third memory cells. Thus, the present invention provides for a double-almost-adjacent error detection and correction, to handle such cases. This corresponds to a "two out of three" adjacent memory cell correction scheme, and operates on the same rules as in the first and second embodiments discussed above. Using the same mathematical approach of the previous embodiments, we find the following equation that provides the relationship of check bits (c) required to support the data bits (k) $k+c-1 < 2^{c-2}$.

FIG. 9a provides a table of syndromes that correspond to either single errors, double-adjacent errors, triple-adjacent errors, or double-almost-adjacent errors, that can be corrected according to a block code of the third embodiment. This table is for a (23,7) code, which includes 16 data bits and 7 check bits. The equations for determining the 7 check bits c0 to c6 are given in FIG. 9b. The xor of the stored and the regenerated check bits produces the 7-bit syndrome s(6:0). The syndrome is decoded to control bit inversion and thereby produce a corrected data word. The last column in FIG. 9a defines the data bit to be inverted for each syndrome that results from a single correctable error (e.g, the value "X"). The correctable class comprises any combination of three adjacent bits (single, double-adjacent, double-almost-adjacent, and triple-adjacent).

Thus, referring to FIG. 9a, if the syndrome 31hex was computed, that would imply that an error existed in data bit position X−1 and the data bit position X. Since the value 31hex corresponds to the row for data bit d8, this means that data bits d7 and d8 are in error, and thus would have to be inverted to output a corrected 16-bit data word. Similarly, if the syndrome, 54hex was computed, this would correspond to an error in data bit position X and data bit position X+2 (double-almost-error), where those correspond to data bits d3 and d5.

A seven-input decoder followed by sixteen OR gates (not shown) may be utilized to gate all of the syndromes that affect a given data bit. The output of the OR gates is the 16-bit correction vector used to complement erroneous bits from the an output word of a RAM. Hardware error correction circuitry can be utilized with the computed syndrome, and details of such circuitry are not provided herein, but are known to those skilled in the art.

Figure 10:
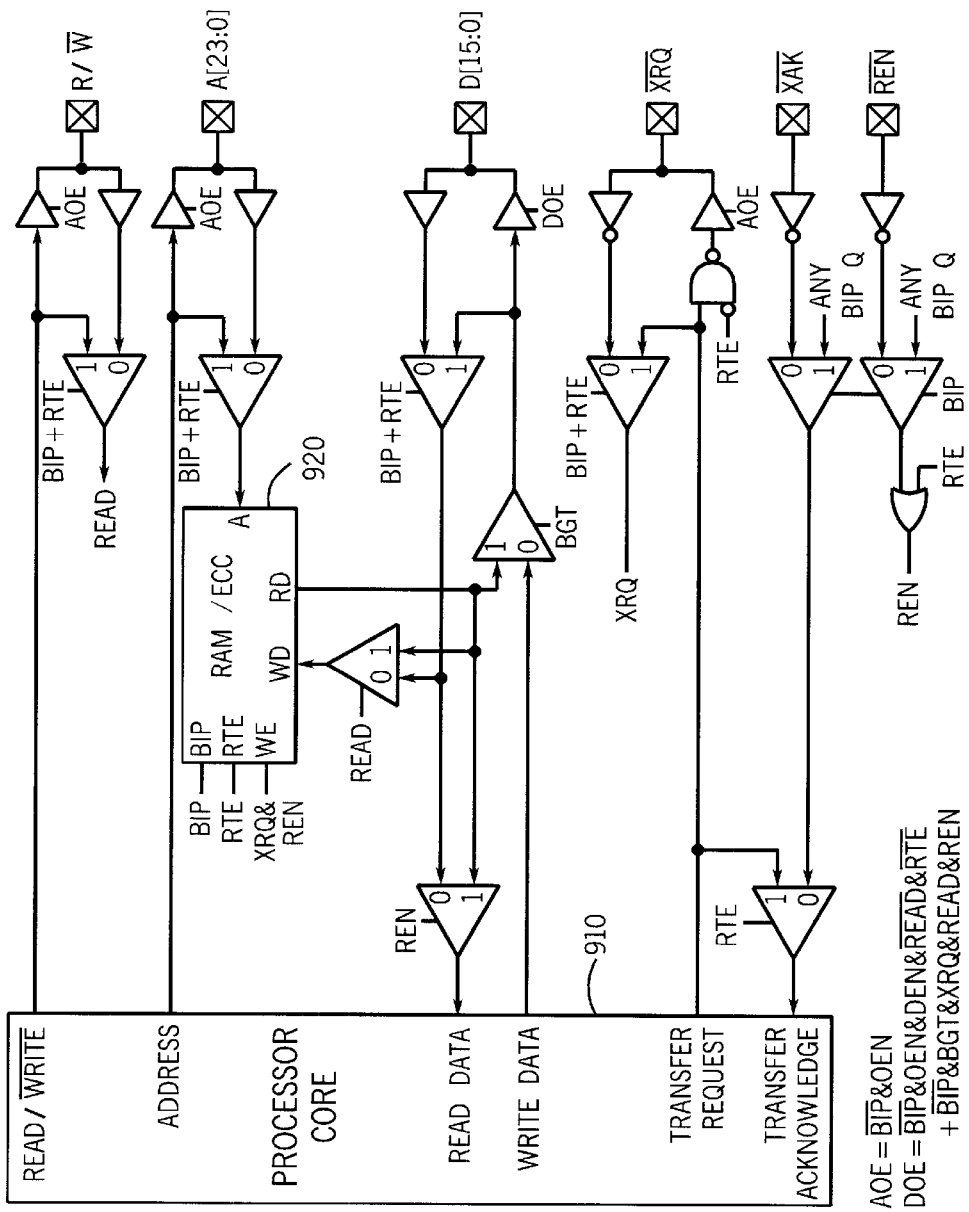
FIG. 10 shows a block diagram of RAM interface logic for built-in-self test according to a fourth embodiment of the invention.

A fourth embodiment of the invention is shown in FIG. 10, which shows the RAM interface logic provided for an error-correction-assisted built-in-self-test (BIST) apparatus. FIG. 10 shows a processor core 910. An on-chip RAM 920 provides words of high speed storage for stacks and other variables used by the processor core 910. Read data is provided to the processor core 910 via the "read data" input of the processor core 910, and write data is written to the RAM 920 from the "write data" output of the processor core 910. Addresses for write/read are provided to the RAM by way of the address port of the processor core 910. For the fourth embodiment, an error-correcting code, such as one described in any of the first through third embodiments, is employed for protection against NSEU events. Scrubbing in a background software is supported by automatically initiating a write-back following each read. To support testing and development, the RAM 920 is accessible from a local bus (not shown), and core-to-RAM accesses are visible on the local bus.

The RAM block 920 is connected between the processor core 910 and the pins shown in FIG. 10. The RAM block 920 is enabled to respond when REN=1. The external inputs are ignored while BIST is in progress (BIP=1) and when the microcode has enabled RAM test (RTE=1). During RAM test, assertion of XRQ__ is inhibited.

The address output enable AOE is forced low during BIST and following the OEN output of the arbitration logic otherwise. The data output enable DOE is also forced low during BIST. When the processor core 910 has control of the local bus, the data is driven out while DEN=1 during write accesses. If an external master has control, as indicated by BGT=1, then read data from the RAM block 920 is driven out while XRQ__ and REN__=0.

One possible configuration of the RAM block logic is shown in FIG. 11. A 16K×23 bit RAM array 1010 provides storage for 16 bits of data and 7 error-correction check bits. Of course, the RAM may be modified to handle other-sized codewords, and be capable of storing a different number of codewords. The address, write enable and data inputs to the RAM 920 are registered.

Seven check bits are generated from the 16-bit write data WD(15:0) in each clock, cycle. When reading the RAM, the seven check bits are xor'ed with the expected seven-bit check code, via XOR logic 1030, to produce a syndrome. The syndrome identifies any correctable bit errors, with a syndrome of zero indicating no errors. The syndrome is decoded by syndrome decode logic 1065 to selectively invert, via XOR logic 1040, those data bits that are in error, thereby correcting any errors in the 16-bit data word. The RAM has a bypass path that allows pseudo-random BIST of all but the RAM array itself. The RAM array 1010 and associated circuitry is tested by a microcoded routine that performs writes and checks read results. The test-check logic 1050 provided on the bypass path converts the 23-bit RAM output to a 16-bit code as defined by the values in FIG. 12.

Figure 13:
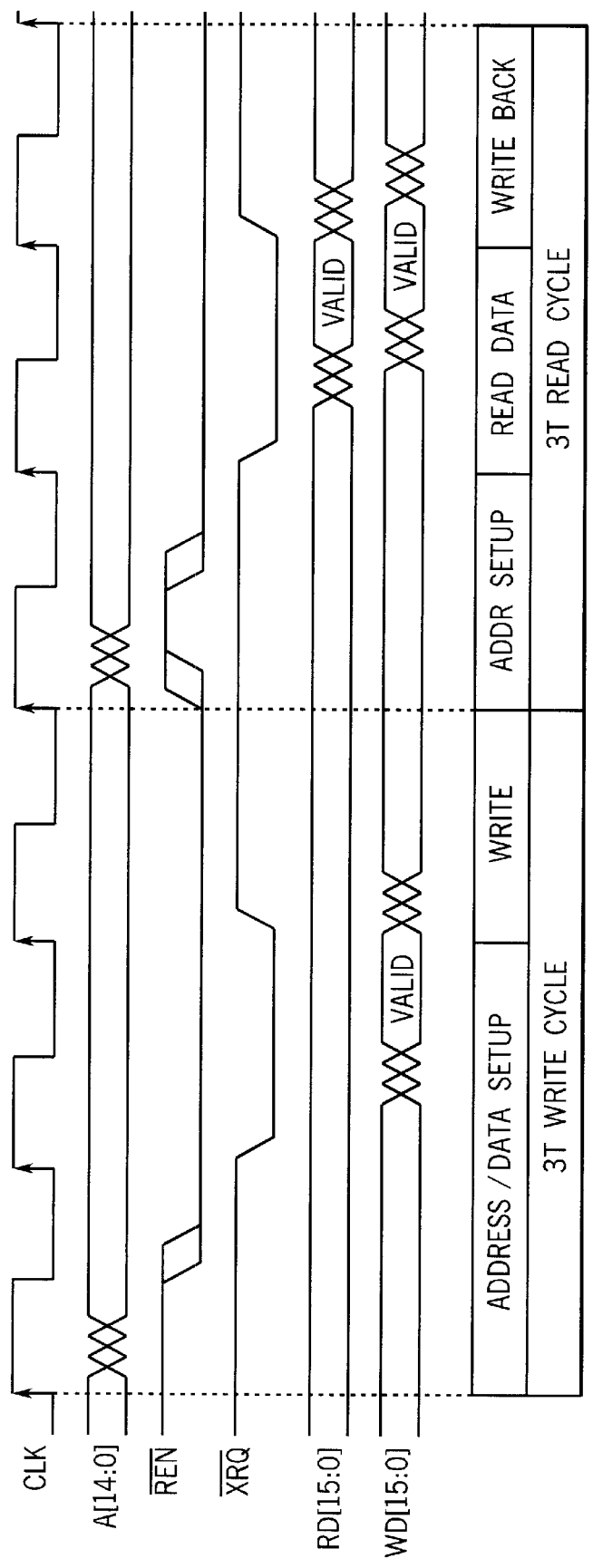
FIG. 13 is a timing diagram of RAM access timing according to the fourth embodiment of the invention.

The RAM subsystem performs 3T read and write transfers. As shown in the timing diagram of FIG. 13, there are three portions to a read RAM cycle: address setup, data read and correct, and write back corrected value. Write cycles comprise two operations: address and data setup, and write to RAM. Both read and write RAM transfers have a write to the RAM in the third cycle.

The code generators 1070, 1075 of FIG. 11 produce seven check bits c(6:0) from a 16-bit data word d(15:0) as defined by the check bit equations in FIG. 9b. This error correction code can detect and correct all error combinations in three adjacent bits, using the syndromes of FIG. 9a. This error correction code can also accommodate microcoded RAM test that employs all-zero, all-one, and alternating zero/one data patterns. As given in FIG. 14, the check code output replicates the input bit pattern for the four cases of interest. This allows the RAM to be properly exercised and accommodates the test check logic 1050 of FIG. 11.

While preferred embodiments have been described herein, modification of the described embodiments may become apparent to those of ordinary skill in the art, following the teachings of the invention, without departing from the spirit and scope of the invention as set forth in the appended claims. For example, as semiconductor memory densities get greater and greater due to technological advances, a single NSEU event may affect four or more contiguous memory cells for future semiconductor memories. As such, an error correcting code according to the present invention may be provided to correct for either single errors, double-almost adjacent errors, triple-errors, or quadruple errors (e.g., any combination of errors in four contiguous codeword bits). Such a scheme would utilize the uniqueness properties for exclusive-ors of the respective columns and groups of columns of a block code matrix designed for this purpose, as provided earlier. For example, the block would be designed to correct for any single error (e.g., 1000, 0100, 0010, or 0001, where '1' signifies an error), any two errors (e.g., 1010, 1001, 0101, 0110, or 0011), any three errors (e.g., 1011, 0111, 1101, or 1110), and four errors (1111) in a set of four contiguous data bits affected by an NSEU event. Any number of contiguous errors (and adjacent errors) may be corrected by way of the invention, utilizing the rules described earlier. Thus, a set of five adjacent bit positions, a set of six adjacent bit positions, etc., may be corrected according to the invention. Similarly, the teachings of this invention can be applied to create custom block codes that meet additional software rule specifications. The block code that produces the syndromes of FIG. 9a were produced with the aforementioned triple adjacent rules and an additional rule that simplifies the test logic of the RAM. FIG. 14 shows the attained characteristic of the block code check bit generation using one additional rule. Such extensions and/or customizations are logical applications of the present invention.

Also, the present invention may be utilized with conventional error correction techniques, to provide enhanced error correction and detection. For example, the addition of a parity bit can be utilized to provide an additional level of error detection.

Still further, the present invention may be utilized with interleaving techniques to correct for errors in adjacent memory cells which may correspond to non-adjacent codeword locations due to the interleaving. For example, for a two-level interleave, the almost-adjacent error correction will effectively correspond to the double-adjacent error correction, since two contiguous memory cells map to two bits of a codeword that have another bit interleaved there between.

While the present invention has been described with respect to correcting errors introduced by way of NSEUs, the present invention may also be used to correct temporary or permanent errors in integrated circuit memory cells caused by other conditions. Radiation, single event upsets, and NSEUs are typical causes of the temporary errors discussed with respect to the embodiments of the invention. Mask defects, impurities, and fabrication defects are typical causes of permanent errors in memory cells. All of these problems have a physical localized effect on the semiconductor memory, and as such, the error correction codes created according to the present invention can efficiently correct the errors generated by mask defects, impurities and fabrication defects as well.

What is claimed is:

1. A method of error correction, the method comprising:
   a) providing a block code matrix having a plurality of columns such that an exclusive-or value of any two adjacent columns of the block code matrix and corresponding values representative of data disposed in each column of the block code matrix are unique with respect to each other, wherein the corresponding values representative of the data disposed in each column are stored in machine readable form; and
   b) computing a syndrome of a codeword using the block code matrix, and correcting for any single errors and any double-adjacent errors based on the computed syndrome.

2. The method according to claim 1, wherein the block code matrix provides for error correction due to neutron single event upset occurrences.

3. The method according to claim 1, wherein the block code matrix is provided in step a) by one of an exhaustive tree search and a genetic algorithm approach.

4. The method according to claim 1, further comprising the step of:
   c) prior to step b), providing the block code matrix such that an exclusive-or value of any two almost-adjacent columns of the block code matrix and corresponding values representative of data disposed in each almost-adjacent column are unique with respect to each other, wherein the syndrome computed in step b) is utilized to correct for any single errors, any double-adjacent errors, and any almost-adjacent errors.

5. A method of error correction, comprising;
   a) providing a block code matrix In an electronic processing device wherein an exclusive-or value of any two adjacent columns of the block code matrix, an exclusive value of any three adjacent columns, and a value corresponding to a numeric representation of each column are unique with respect to each other; and
   b) computing in an electronic processing device a syndrome of a codeword using the block code matrix, and correcting for any single errors, any double-adjacent errors, and any triple-adjacent errors based on the computed syndrome.

6. The method according to claim 5, wherein the block code matrix provides for error correction due to neutron single event upset occurrences.

7. The method according to claim 5, wherein the block code matrix is provided in step a) by one of an exhaustive tree search and a genetic algorithm approach.

8. The method according to claim 5, further comprising:
   a1) prior to step b), providing the block code matrix wherein an exclusive-or value of any two columns separated by one column is unique to all of the other values provided in the step a).

9. A method of error correction, comprising:
   a) using an electronic device to identify syndromes for correcting single errors of a code word that includes check bits and data bits using a block code matrix wherein an exclusive-or value of any two adjacent columns of the block code matrix and corresponding values representative of data disposed in each column are unique with respect to each other; and
   b) using the electronic device to identify syndromes for correcting at least double-adjacent errors of the code word using the block code matrix,
      wherein the syndromes computed in steps a) and b) are unique with respect to each other.

10. The method according to claim 9, further comprising:
    c) computing a syndrome value for a received codeword, wherein the computed syndrome value is utilized to determine if any single error or double-adjacent errors exist in the received codeword.

11. The method according to claim 9, wherein the syndromes in the step b) are computed by calculating exclusive-or values for corresponding adjacent columns of a block code matrix utilized to creating the codeword.

12. A method according claim 9, further comprising:
    c) identifying syndromes for correcting at least one of triple-adjacent errors and double-adjacent errors of the code word,
       wherein the syndromes computed in steps a), b) and c) are unique with respect to each other.

13. The method of claim 12, wherein the block code matrix is a (K×C)×C matrix, where C corresponds to a number of check bits and K corresponds to a number of data bits.

14. The method of claim 13, wherein the block code matrix is a 9×5 matrix.

15. The method of claim 14, wherein the matrix is block code is:

101001000
010100100
001000010
000010100
001101001.

16. The method of claim 13, wherein the block code matrix is a 22×6 matrix.

17. The method of claim 15, Wherein the block code matrix is:

010001010100000100010
001001001010010001000
100100010000010100000001
000001001010101010001
100010000010010011010
001010001001000110100.

18. The method of claim 9, further comprising:
creating the block code matrix using a software tree-searching algorithm.

19. The method of claim 9, further comprising:
creating the block code matrix using a depth-first searching algorithm.

20. The method of claim 9, further comprising:
creating the block code matrix using a genetic algorithm.

* * * * *